US008924911B2

United States Patent
Colleran et al.

(10) Patent No.: US 8,924,911 B2
(45) Date of Patent: Dec. 30, 2014

(54) EQUATION BASED TRANSIENT CIRCUIT OPTIMIZATION

(71) Applicant: Synopsys, Inc., Mountain View, CA (US)

(72) Inventors: David Colleran, Pasadena, CA (US); Talal Al-Attar, Fremont, CA (US); Sunderarajan Sunderesan Mohan, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/716,067

(22) Filed: Dec. 14, 2012

(65) Prior Publication Data

US 2013/0159958 A1    Jun. 20, 2013

Related U.S. Application Data

(60) Provisional application No. 61/576,208, filed on Dec. 15, 2011.

(51) Int. Cl.
G06F 17/50    (2006.01)

(52) U.S. Cl.
CPC ........ *G06F 17/5068* (2013.01); *G06F 17/5036* (2013.01)
USPC .......................................... 716/134; 716/132

(58) Field of Classification Search
USPC .................................................. 716/132–135
See application file for complete search history.

(56) References Cited

U.S. PATENT DOCUMENTS

| | | | |
|---|---|---|---|
| 7,458,041 B2 | 11/2008 | Hershenson et al. | |
| 7,703,050 B2 | 4/2010 | Hershenson et al. | |
| 7,783,996 B2 | 8/2010 | Hershenson et al. | |
| 8,183,894 B2 | 5/2012 | Nuttinck et al. | |
| 8,307,309 B1 | 11/2012 | del Mar Hershenson et al. | |
| 2005/0235232 A1* | 10/2005 | Papanikolaou et al. | 716/1 |
| 2008/0072183 A1 | 3/2008 | Hershenson et al. | |
| 2008/0077890 A1 | 3/2008 | Hershenson et al. | |
| 2009/0019411 A1* | 1/2009 | Chandra et al. | 716/9 |
| 2009/0150847 A1* | 6/2009 | Morgenshtein et al. | 716/11 |
| 2010/0017186 A1 | 1/2010 | Kim et al. | |
| 2010/0153900 A1 | 6/2010 | Mohan et al. | |
| 2010/0299649 A1 | 11/2010 | Hershenson et al. | |

* cited by examiner

*Primary Examiner* — Binh Tat
(74) *Attorney, Agent, or Firm* — Adams Intellex, PLC

(57) ABSTRACT

Circuit simulation can be performed on digital, analog, and mixed signal types of circuitry. Phases of operation are identified for a circuit and transient behavior is analyzed. Multiple time points are identified and the circuit is replicated for those time points with evaluation of the circuitry performed at those various time points. Simultaneous optimization is performed across the time points. Transistors and other devices can have their lengths, widths, and number of fingers optimized. Simulation can include determining Kirchhoff current law equations for various nodes within the circuit. Equations describing device operation can include non-convex signomial equations and convex polynomial equations.

39 Claims, 8 Drawing Sheets

EQUATION BASED TRANSIENT CIRCUIT OPTIMIZATION

RELATED APPLICATIONS

This application claims the benefit of U.S. provisional patent applications "Equation Based Transient Circuit Optimization" Ser. No. 61/576,208, filed Dec. 15, 2011. The foregoing application is hereby incorporated by reference in its entirety.

FIELD OF ART

This application relates generally to circuit simulation and more particularly to automated equation based transient circuit optimization.

BACKGROUND

Integrated circuit design and fabrication is a vastly difficult effort and involves complex interaction among numerous aspects of the circuit being designed. Analog circuit design further complicates the design process because of interactions among the numerous devices of the design. Detailed understanding of active and passive device operation, timing, and interaction within a circuit is critical to successful circuit design. Scaling of the devices must result in correct circuit operation during all phases of operation. Large numbers of devices may be present in an integrated circuit; frequently millions and even hundreds of millions of transistors are included. Each transistor, composed of shapes for diffusion, polysilicon, contacts, metallization, and other structures, must be correctly scaled in order to operate properly. The ability to design chips with such large numbers of essential transistors can be quite challenging and needed optimization of the circuitry can be a daunting task even with the help of electronic design automation (EDA) software tools.

There are numerous devices of miniscule dimension in close proximity to one another on each semiconductor chip. Detailed analysis of the analog aspects of the devices is critical to successful circuit design. Signal voltages, noise, device scaling, and the like must all be considered. All of the transistors must be properly scaled and fabricated to exacting specifications. As technologies have advanced, smaller and smaller lithographic dimensions are used. These smaller dimensions require smaller signal voltages and closer design tolerances of the devices. Signal noise, leakage current, and the like are also critical design considerations. Each of these and other design parameters must be carefully considered in order for the circuit of interest to function properly. Significant design effort is required during the development process. Circuit designers require complex tools in order to analyze and scale the devices especially as circuits interact with each other. Various conditions under which a circuit needs to operate must likewise be evaluated.

SUMMARY

Design and analysis of critical characteristics and operation of active devices in integrated circuits are essential to successful system implementation. Circuits are very complex and careful optimizing is required in order to develop circuits that properly operate at peak efficiency. A computer-implemented method for circuit evaluation is disclosed comprising: obtaining a representation for a circuit wherein the representation describes a plurality of devices and connections between the devices; importing models for the plurality of devices included in the representation; identifying N time points of operation for the circuit; instantiating the circuit N times; and optimizing the circuit simultaneously at the N time points.

The devices may include one or more of transistors, capacitors, inductors, or resistors. The optimizing may include setting transistor dimensions within the circuit. The transistor dimensions may include one or more of lengths, widths, or finger numbers. The optimizing may include one or more of reducing delay through the circuit, reducing power consumption for the circuit, or reducing area for the circuit. The method may further comprise capturing transient behavior of the circuit for each of the N time points. Transistors, within the circuit, may transition through a plurality of regions of operation. Simulation may be performed on the plurality of regions of operation. The method may further comprise linking each of the plurality of regions for circuit design. The regions of operation may include two or more of off, sub-threshold leakage, linear, and saturated states. The representation may include a schematic. The representation may include a netlist. The time points may be linked by a voltage delta. The voltage delta may be based on dynamic currents within the circuit. The dynamic currents may be based on capacitances within the circuit. The time points may be linked by a current delta. The current delta may be based on dynamic voltages within the circuit. The dynamic voltages may be based on inductances within the circuit. The method may further comprise determining DC currents for nodes within the circuit. The method may further comprise generating Kirchhoff current law equations for the nodes using the DC currents. The method may further comprise determining dynamic currents for the nodes within the circuit. The method may further comprise generating Kirchhoff current law equations for the nodes using the dynamic currents. The Kirchhoff current law equations may be relaxed at an initial solver iteration. The models for the plurality of devices may include convex polynomial equations. The models for the plurality of devices may include non-convex signomial equations. The optimizing may include non-linear optimization techniques. The method may further comprise determining a DC operating point for the circuit. The method may further comprise initializing the plurality of devices based on the DC operating point. The method may further comprise constraining behavior of the circuit during the N times. The method may further comprise generating transient equations for the circuit. The method may further comprise generating AC noise equations for the circuit. The method may further comprise optimizing a second circuit coupled to the circuit wherein the circuit and the second circuit are optimized together. The circuit and the second circuit may be optimized at different time points. The circuit may include multiple levels of hierarchy. The multiple levels of hierarchy may be optimized together.

In embodiments, a computer program product embodied in a non-transitory computer readable medium for circuit evaluation may comprise: code for obtaining a representation for a circuit wherein the representation describes a plurality of devices and connections between the devices; code for importing models for the plurality of devices included in the representation; code for identifying N time points of operation for the circuit; code for instantiating the circuit N times; and code for optimizing the circuit simultaneously at the N time points. In some embodiments, a computer system for circuit evaluation may comprising: a memory which stores instructions; one or more processors coupled to the memory wherein the one or more processors are configured to: obtain a representation for a circuit wherein the representation describes a plurality of devices and connections between the devices; import models for the plurality of devices included in the representation; identify N time points of operation for the circuit; instantiate the circuit N times; and optimize the circuit simultaneously at the N time points.

Various features, aspects, and advantages of numerous embodiments will become more apparent from the following description.

BRIEF DESCRIPTION OF THE DRAWINGS

The following detailed description of certain embodiments may be understood by reference to the following figures wherein.

DETAILED DESCRIPTION

Figure 1:
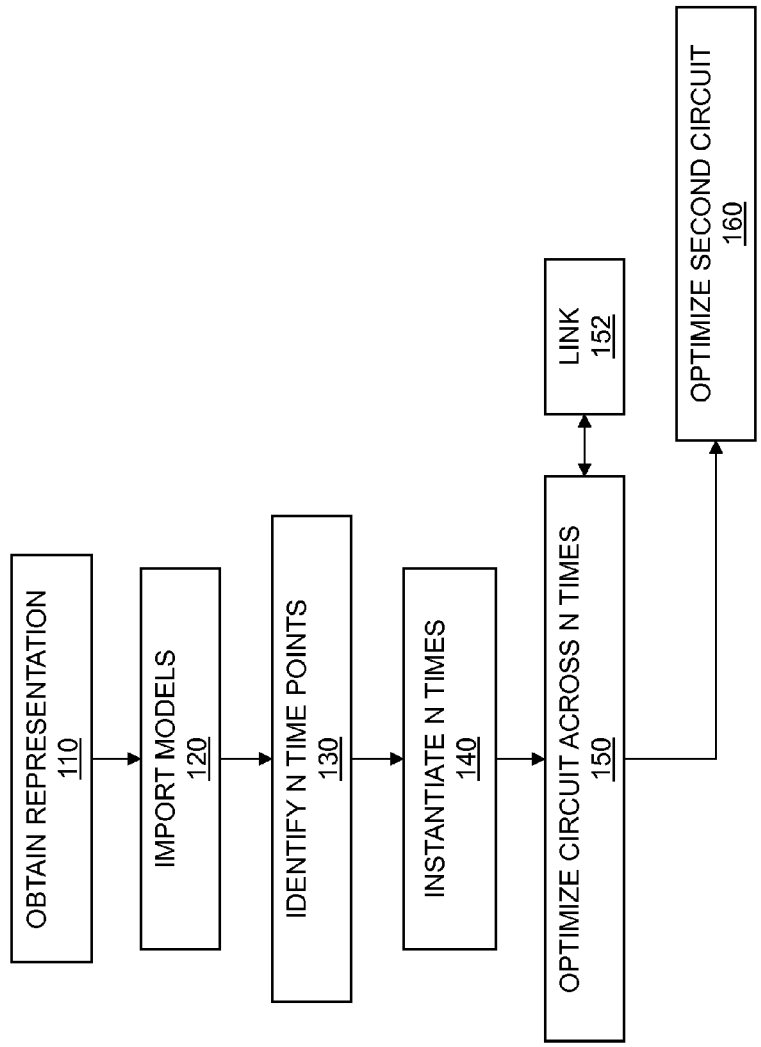
FIG. 1 is a flow diagram for circuit optimization.

Circuit design includes the optimization of device sizes within a circuit. Circuit performance can include DC, AC, transient, physical (i.e., area), noise, and mismatch behavior or a combination thereof. As various stages of the circuitry interact with one another the operation can become even more complex. Efficient optimization is a very challenging exercise. Historically, optimization has included changing a device dimension and simulating the result of that dimensional change. Repeated changes and simulations were used to iteratively arrive at an improved solution. Circuit operation is severely non-linear and therefore determining global optima is very difficult. Devices can include resistors, inductors, capacitors, and transistors. The active devices, i.e. transistors, have multiple regions of operation such as off-states, sub-threshold leakage, linear regions as well as saturated regions. The transistors can include NFETs, PFETs, Fin-FETs, bipolar devices, and so on. The description of these various phases of operation and the associated description equations make optimization problematic. Frequently, operation has been described empirically with discontinuities between regions of operation. Beyond this, the accuracy of Kirchhoff current equations has not been maintained.

Using the disclosed concepts allows for optimizing circuits with multiple devices in a computationally efficient manner. Kirchhoff current equations can be evaluated in both DC and dynamic fashions. Multiple time points can be determined for circuit evaluation and the circuit under evaluation can be replicated for each of those time points. Then those circuit replications can all be optimized simultaneously. Further, multiple stages of circuitry can be optimized together where each stage has different time points determined for evaluation.

In almost any circuit, devices may change regions of operation (e.g. linear to saturation) and optimization across regions is crucial. Some circuit examples where large-swing transient behavior is important include inverter chains, comparators/samplers, critical paths, or any custom circuit in which devices change region of operation or where time-domain behavior is important. The disclosed concepts can optimize these designs by instantiating (or replicating) a circuit N-times, where "N" is the number of time points. The DC currents (including the Ids of a transistor) and the dynamic currents (e.g. $C*dv/dt$ values) at each node and at each time point can be evaluated. The time points can be linked to one another by a "dv" (or $\Delta V$) term, often used in the dynamic current calculation. Similarly, dynamic voltages can be evaluated (e.g. $L*di/dt$ values) across nodes in the circuit. In this situation the time points can be linked by a "di" (or $\Delta I$) term. The circuit can then be simultaneously optimized at the time points. The optimization can take many forms including minimizing delay, power, or area. The optimization can find the best device sizes (e.g. transistor widths and lengths) for the circuit and its objectives.

FIG. 1 is a flow diagram for circuit optimization. A flow 100 is described which includes a computer-implemented method for circuit evaluation. The flow 100 includes obtaining a representation 110 for a circuit wherein the representation describes a plurality of devices and connections between the devices. The representation, as mentioned in this disclosure, should be understood that to be various forms of electrical representation. The representation may be a netlist, schematic, or other description. In some embodiments, both netlists and schematics may be used together. The obtaining may include importing a schematic for a circuit. The schematic may be a graphical representation of the logical blocks, individual transistors, or other components of a semiconductor chip and interconnections between the blocks, transistors, or components. The schematic may be imported into a database to be included with other information about the chip. The entire chip schematic may be imported or a schematic for a subset of the chip circuitry may be imported. In some embodiments, the schematic may already reside within a software tool and importing may be construed as using a schematic already present in the tool. The schematic may be in the form of a SPICE™ netlist, by way of example, or some other format for describing devices and their relationships to other elements in a semiconductor circuit. All device descriptions may be imported, a subset of the device descriptions, or only a single description.

The flow 100 includes importing models 120 for the plurality of devices included in the representation. The devices may include various types of components in a circuit. The devices may include one or more of transistors, capacitors, inductors, resistors, voltage sources, current sources, dependent sources, or any other electronic device for which mathematical models can be created. The models may be any circuit models appropriate to the analysis. The models may be SPICE™ models, MATLAB™ models, ANSYS™ models, or the like. The models are in computer readable form. The models may be in the forms of various types of equations. The models for the plurality of devices may include convex posynomial equations. The convex posynomial equations may be a sum of products between coefficients and variables raised to an exponent. The coefficients and the exponents may each be positive real numbers. The models for the plurality of devices may include non-convex signomial equations. The non-convex signomial equations may be a sum or difference of products between coefficients and variables raised to an exponent.

The flow 100 includes identifying N time points 130 of operation for the circuit. The number N may be any integer representing the number of times over which the circuit is evaluated. In practice, the number N may be three, five, ten, or any integer. The value for N is practically limited by optimization time and computational complexity. The number of time points is based on the rate of slew for a signal, the amount of time a circuit is in transient operation, and other factors.

The flow 100 includes instantiating the circuit N times 140. Based on the number of time points over which evaluation is needed, the circuit is replicated this number of times. These replications are used to focus on circuit operation at those specific points.

The flow 100 includes optimizing the circuit simultaneously across the N time points 150. By characterizing the circuit at the N time points through the N instantiations, the transient behavior of the circuit can be properly evaluated. These N evaluations can then be optimized simultaneously. The various devices within the circuit can be optimized. While the arrangement of the devices (also known as circuit topology) may not be changed, the values e.g. capacitance or resistance values may be chosen. The optimizing may include setting transistor dimensions within the circuit. The transistor dimensions may include one or more of lengths, widths, or finger numbers. A length and width of a transistor can be defined by diffusion shapes (both P and N type), polysilicon shapes, well shapes (both P and N type), as well as others. The number of fingers can be the number of polysilicon shapes that make of the fingers and can also represent the multiplicity factor for the number of similar transistors in parallel. The optimizing may include one or more of reducing delay through the circuit, reducing power consumption for the circuit, or reducing area for the circuit. Any transient behavior, DC behavior, shape related value, or the like can be optimized. The flow 100 may include capturing transient behavior of the circuit for each of the N time points. The transient behavior can include dynamic currents, slew rates, voltage deltas, and the like. The flow 100 may include linking 152 each of a plurality of regions for circuit design where the plurality of regions includes regions of operation for the circuit. For effective simulation of a particular circuit, it may be necessary to link a particular active device in a circuit across the various phases of operation for analysis. For example, if a particular transistor is selected for implementation in a particular design, then that transistor would be used across the various phases for analysis of the circuit. That is, a given transistor within a given circuit would refer to the same transistor within a circuit irrespective of phase of analysis. Various phases of circuit operation may exist for an integrated circuit and may correspond to the regions. These phases may include cutoff, linear, and saturation for the active devices. The optimization may include various non-linear optimization techniques especially as global optima are sought for a given circuit. The optimizing would include sizing transistors included in the schematic. Determining the dimensions or sizes of various active devices is critical to successful implementation of a given circuit. The sizing of transistors may be determined individually or may be determined based on a multiple of standard size devices. In some embodiments, sizing of active devices may involve finding sizes for those devices such that those devices will operate effectively across all phases of operation. In some cases, the count or cloning of transistors may be included as well. The resulting sizes may be included in the schematics. The sizes may be output in a transistor level netlist. The sizes may be used for further circuit analysis. Various types of optimization are possible including transient optimization, periodic steady state optimization, and so on. Periodic steady state optimization may be achieved by equating the voltage and currents, and their derivatives, at initial and final time points, for a circuit which would operate in a periodic fashion.

The flow 100 may further comprise optimizing a second circuit 160 coupled to the circuit, also known as the first circuit, wherein the circuit and the second circuit are optimized together. The first circuit and the second circuit may be at the same or differing levels of hierarchy. The first circuit and the second circuit may be of similar or different types. In some cases the first and the second circuit may be in series so that the output of the first circuit drives the second circuit and the optimizing may include reducing delay through the combined first and second circuit series. Various steps in the flow 100 may be changed in order, repeated, omitted, or the like without departing from the disclosed concepts. Various embodiments of the flow 100 may be included in a computer program product embodied in a non-transitory computer readable medium that includes code executable by one or more processors.

Figure 2:
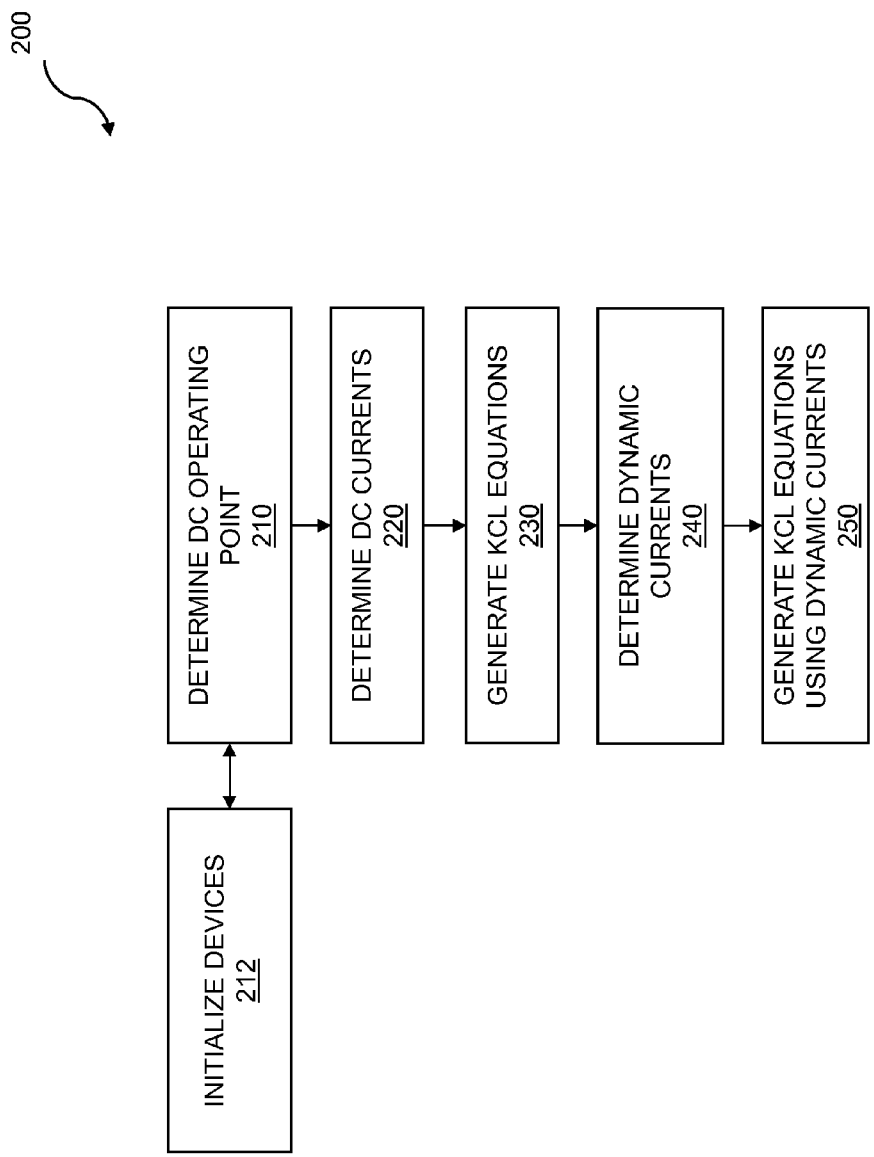
FIG. 2 is a flow diagram for current analysis.

FIG. 2 is a flow diagram for current analysis. Evaluation of currents, both AC and DC values, are critical to determine circuit operation. A flow 200 about currents may continue from or be part of the previous flow 100. The flow 200 describes various types of current analysis that can be part of a simulation. The flow 200 may include determining a DC operating point 210 for the circuit. For certain CMOS circuits, a DC operating point can be when each of the transistors within a circuit are either entirely "on" or entirely "off," in which case the DC operating point is fairly straight forward. For other circuits, such as mixed signal circuits like a PLL, the DC operating point is far more complex. The flow 200 may include initializing the plurality of devices 212 based on the DC operating point. By setting the devices within a circuit at their appropriate DC operating point, proper transient circuit simulation can then be performed. The DC operating point would include correct voltages for nodes within a circuit and correct currents through certain devices, such as resistors and transistors. The flow 200 may further comprise determining DC currents 220 for nodes within the circuit. The DC currents must maintain conservation of charge so that the sum of currents which flow into a node must also flow out of a node. Thus, the flow 200 may further comprise generating Kirchhoff current law equations 230 for the nodes using the DC currents. In some embodiments, the Kirchhoff current law (KCL) equations may be relaxed at an initial solver iteration. This initial solution point may allow for loss of charge conservation in order to ease calculation for the DC operating point.

The flow 200 may further comprise determining dynamic currents 240 for the nodes within the circuit. By understanding the dynamic currents within a circuit, transient behavior can be determined. Dynamic currents can be used to determine voltage deltas over small periods of time. The dynamic currents may be based on parasitic capacitances within the circuit. Parasitic capacitances can be between various metalization layers, across reverse biased diffusions, and any place where a dielectric exists. The flow 200 may further comprise generating Kirchhoff current law equations for the nodes using the dynamic currents 250. Using KCL equations for dynamic currents, relationships between nodes can be evaluated. Various steps in the flow 200 may be changed in order, repeated, omitted, or the like without departing from the disclosed concepts. Various embodiments of the flow 200 may be included in a computer program product embodied in a non-transitory computer readable medium that includes code executable by one or more processors.

Using a netlist or other representation as input, A DC test bench may be created which sets up the circuit in a stable, DC operating point. In some embodiments, the input and output may be connected, such as across an inverter so that an operating point at these nodes may roughly be Vdd/2. A DC operating point may be used with instantiated transistors for various current evaluations as well as for transient behavior optimization.

Figure 3:
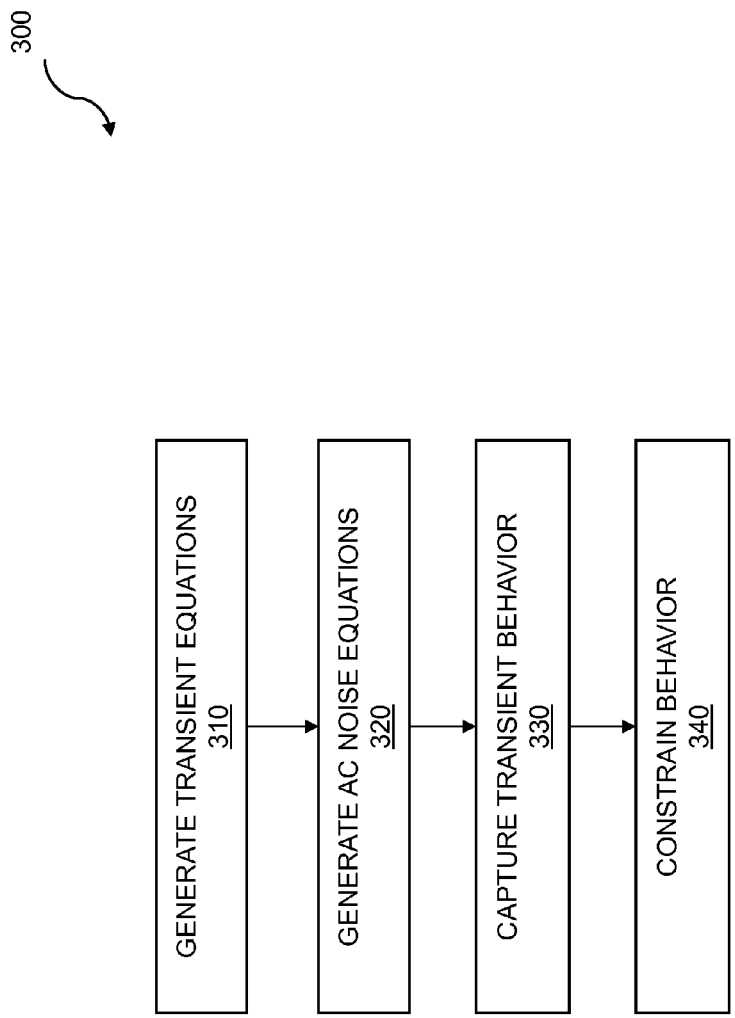
FIG. 3 is a flow diagram for behavior analysis.

FIG. 3 is a flow diagram for behavior analysis. Various types of behavior can be analyzed as part of circuit simulation. A flow 300 may continue from or be part of previous flows 100 or 200. The flow 300 describes some of the various types of behavior analysis but should not be viewed as limiting. The flow 300 may include generating transient equations 310 for the circuit. Slew rates, voltage deltas, dynamic currents, and others can be evaluated using the corresponding equations. For transient optimization these transient equations may be automatically generated with most of the circuit behavior being defined through those transient equations. A user may augment this information by specifying when to include time points or by adding any other constraints that are desired, including for instance noise constraints. In some embodiments, a user can include additional types of equations such as frequency response equations.

In some embodiments, transient equations are automatically generated and stored in a file. In some cases a user may decide to edit this file for further analysis. A software tool can print the transient strings for devices within a circuit into a file. Included in this file is matrix of information stored in a series of vectors and/or matrices and also a list of equivalent nodes defining port/net identities. The file can further contain strings, using the previously described transient strings and identities, describing connections that make up the circuit. These latter strings can include any hierarchy contained within the circuit The flow 300 may further comprise generating AC noise equations 320. Numerous other types of equations may also be included such as DC, small signal, mismatch, area, etc. Based on parasitic capacitances and changes in voltages, noise may be evaluated. Aggressor lines and victim lines can be determined with noise being injected on the victim line or lines. Likewise, based on inductance values and changes in current, noise may be evaluated, such as bounces in power supply and ground lines. Similarly, device noise may be evaluated. Equations for each of these types of noise, or a combination of noises, can be generated. The flow 300 may include capturing transient behavior 330 for the circuit. The transient behavior can be based on the transient equations which were generated as well as, in some embodiments, the AC noise equations.

The flow 300 may include capturing transient behavior of the circuit for each phase from a number of phases of operation. Analyzing a given circuit with certain constraints over a range of phases of analysis yields circuit response results, many of which should be captured. These analysis results may represent the operation of the circuit over a range of voltages and currents. The analysis results may represent the circuit over a range of operating points that may consist of cutoff, linear, saturation, and the like. Circuit analysis may include small signal swing, large signal swing, biasing, and the like. Analysis may include using Kirchhoff's current law (KCL), Kirchhoff's voltage law (KVL), etc. The captured behavior can be stored for later use. The captured behavior can be captured for optimizing the circuit. Further, the captured behavior can be used in conjunction with evaluation of another circuit.

The flow 300 may further comprise constraining behavior 340 of the circuit. The constraining behavior may occur during the N times over which the circuit is being evaluated. The constraining of behavior for the circuit may occur during a number of phases. In order to ensure that the various active devices operate correctly within the appropriate phase of operation during analysis, it may be necessary to constrain some parameters for the devices. For example, for a given transistor to operate appropriately for a given phase, it may be necessary to constrain a voltage applied to its gate in order to keep the transistor in the linear region. The applied voltage may be equal to a specified value, less than a specified value, greater than a specified value, and so on.

Various constraints can be added through a text or software interface. For example, an NFET and a PFET can each be biased in a saturation region. Likewise a linear region biasing can be selected. Constraints may be added to a description for the circuit. Constraints may propagate through levels of hierarchy as is needed. In embodiments, optimization may include flattening of the circuit or a portion of the circuit. Various steps in the flow 300 may be changed in order, repeated, omitted, or the like without departing from the disclosed concepts. Various embodiments of the flow 300 may be included in a computer program product embodied in a non-transitory computer readable medium that includes code executable by one or more processors.

Figure 4:
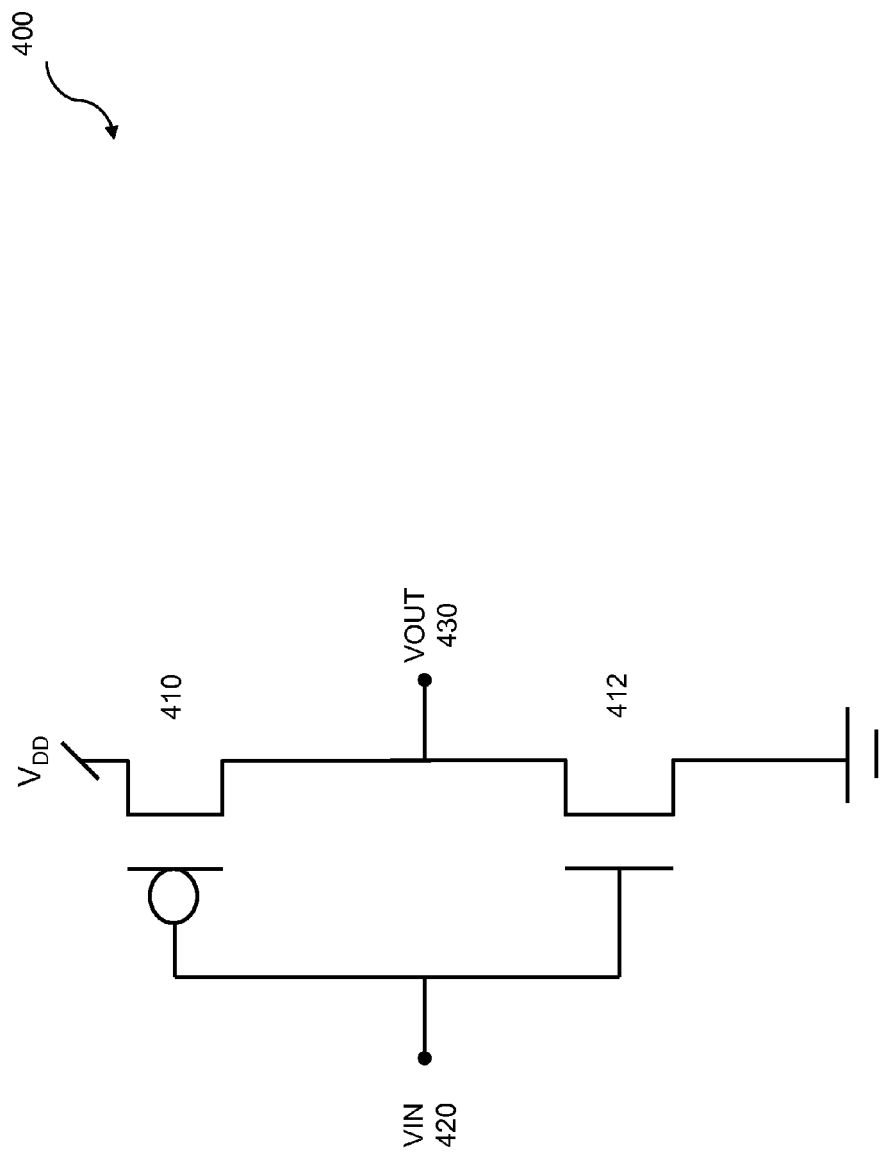
FIG. 4 is an example circuit diagram.

FIG. 4 is an example circuit diagram. While a CMOS inverter is shown, this inverter is an example and should not be viewed as a limitation. Many types of circuits are possible on which to perform optimization. Some other examples include PLLs, SerDes, opamps, strong arm latches, and so on including various digital, analog, and mixed signal circuits. Various representations for a circuit may be used. The representation may include a schematic, such as the schematic 400 shown. The representation may include a netlist. The example circuit 400 includes a PFET 410 and an NFET 412. The PFET 410 has its gate connected to VIN 420. The PFET 410 has its source connected to VDD and its drain connected to VOUT 430. The NFET 412 has its gate connected to VIN 420. The NFET has its source connected to Ground and its drain connected to VOUT 430. The inverter 400 is arranged such that when VIN 420 is high, VOUT 430 is low and likewise with VIN 420 is low, VOUT 430 is high.

When VIN 420 is high, the PFET 410 is in an "off" state and only sub-threshold leakage through the PFET 410 occurs. When VIN 420 is high, the NFET 412 is in the "on" state. When VIN 420 is low, the NFET 412 is in an "off" state and only sub-threshold leakage through the NFET 412 occurs. When VIN 420 is low, the PFET 410 is in the "on" state.

Various types of parasitic capacitances can exist between structures making up the inverter 400. The parasitic capacitances can be between various metal shapes, across reverse biased diffusions, and across dielectrics. The parasitic capacitances can exist between an internal node on the circuit and ground or Vdd, or can exist between internal nodes within the circuit. Dynamic currents may be based on parasitic, intrinsic, and/or designed load capacitances within the circuit and changes in voltages across those capacitances.

When a file is generated describing a circuit, independent or dependent sources may be included as part of a transient test bench for optimization purposes. Independent or dependent sources may also be used to simplify the circuit, without substantially affecting the circuit being optimized. The independent source may include a DC, step, or exponential input. In some cases, a subset of devices within a circuit may be optimized while the others retain their values. In cases, the subset may be optimized by having sources replace the devices which are excluded from optimization. A user may add equations as desired to aid in the design and optimization process.

In embodiments, an input structure for the test bench can be derived from the netlist or other representation. The structure may contain some redundant information in different formats. This information may allow functions to be efficiently written and easily understood. Information in the structure may include: cell names, number of time points to evaluate, node names, node types, signal sources, and so on.

A file may be generated containing transient optimization equations printed in a readable format that are useful in describing device models and that are ready for input to an optimization utility. The file may contain the matrix information for a cell which can be used at the higher level as part of a matrix for the top-level. Equivalent node information may be included which indicates which ports are connected to which nets for the top-level circuit. This information may allow the matrix to be reduced, thereby eliminating any unnecessary nodes for lower levels where nets are connected to ports. By combining all this information, a circuit may be evaluated and optimized.

Figure 5:
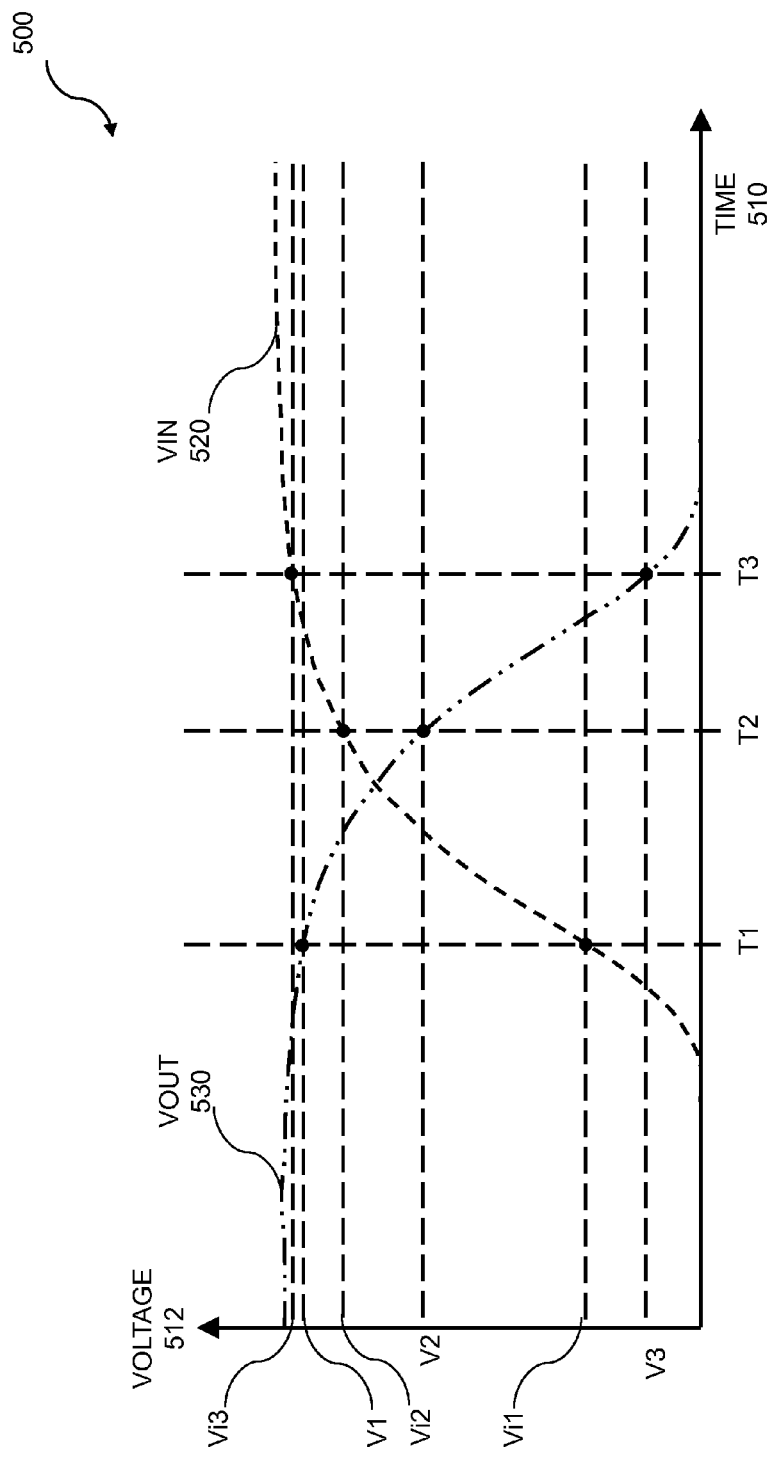
FIG. 5 shows example circuit timing points.

FIG. 5 shows example circuit timing points. The waveform diagram 500 is an example and should not be viewed as a limitation. The waveforms and timing points may correspond to the example circuit 400. A time axis 510 is shown as well as a voltage axis 512. A VIN 520 waveform is shown which corresponds to an input for an inverter. An output waveform VOUT 530 is shown which corresponds to an output for an inverter. For this inverter circuit, three time points have been chosen to evaluate circuit operation as VIN and VOUT change so that one can evaluate transient behavior such as delay or rise/fall times. The three time points correspond to times T1, T2, and T3, with the voltages being V1, V2, and V3, respectively. In this example there are three time points but any number N time points is possible. The analysis may include identifying the N time points of operation for the circuit, where careful selection of the time points may allow fewer points to be taken without substantially affecting accuracy. Across these time points, the transistors within the circuit may transition through a plurality of regions of operation. The characterization may be performed on the plurality of regions of operation. The regions of operation may include two or more of off, sub-threshold leakage, linear, and saturated states. The time points may be linked by a voltage delta. For example, a limit of voltage difference, such as V2-V3, may be chosen for evaluation. If a larger voltage difference is found between times T2 and T3, for instance, another time point may need to be inserted. The voltage delta, e.g. V2-V3, may be based on dynamic currents within the circuit. The dynamic currents can be based on regions of operation for devices within the circuit such as the PFET and NFET, both of which are in saturated regions.

A DC bias version of the circuit may be implemented prior to performing transient analysis. A top-level test-bench for both the DC and transient aspects of the circuit may be created automatically with the circuit of interest included. While this example shows three time points any number is possible. For reference, most small transient circuits typically define five or six time points but any integer number is conceptually possible.

Figure 6:
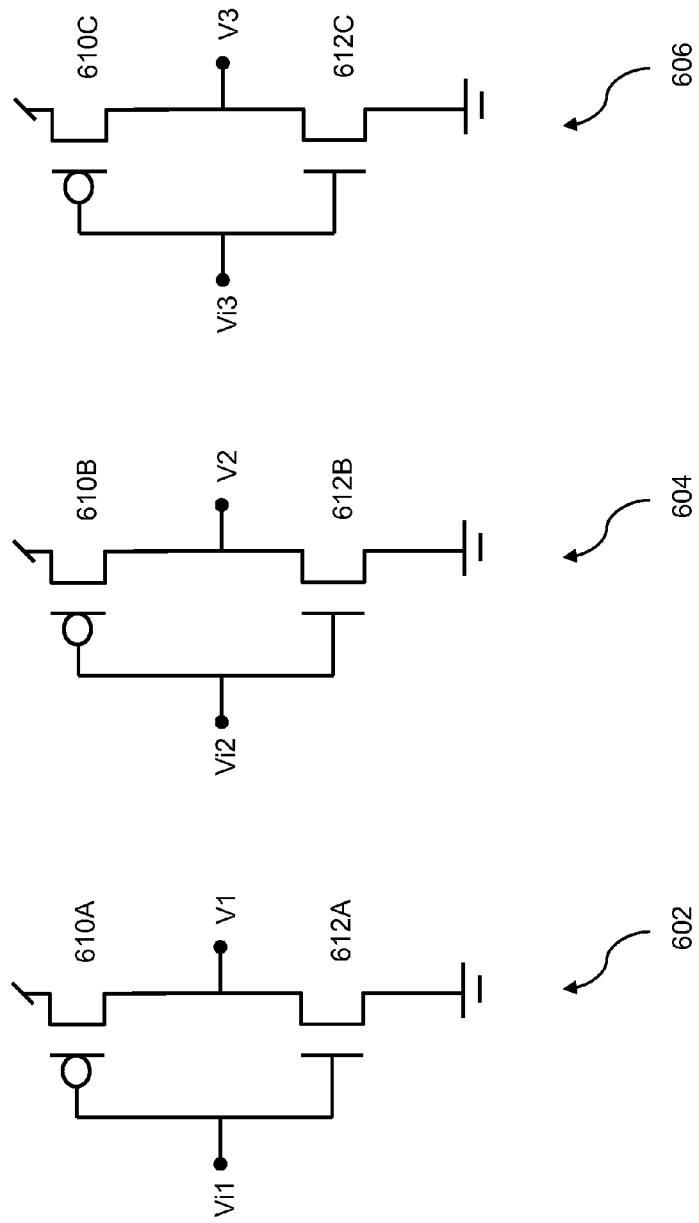
FIG. 6 shows an example circuit diagram with three instantiations.

FIG. 6 shows an example circuit diagram with three instantiations. While a CMOS inverter is shown to be instantiated in this example, this inverter should be viewed as an example and not by way of limitation. Design optimization may include instantiating the circuit N times where N corresponds to the number of time points being evaluated. The instantiations in FIG. 6 may correspond to the inverter 400 and the time points from the waveform diagram 500. A first instance 602 includes a PFET 610A and an NFET 612A. A second instance 604 includes a PFET 610B and an NFET 612B. A third instance 606 includes a PFET 610C and an NFET 612C. The three instances, 602, 604, and 606, may correspond to time points T1, T2, and T3, respectively. For the first instance 602, Vi1 is applied to the input of the inverter. For the second instance 604, Vi2 is applied to the input of the inverter. For the third instance 606, Vi3 is applied to the input of the inverter. Vi1, Vi2, and Vi3 may be mathematical functions of time, i.e., T1, T2, and T3.

Since these three instances, 602, 604, and 606, are all the same inverter, that means that the three NFETs shown 612A, 612B, and 612C are all the same NFET. Likewise the three PFETs shown 610A, 610B, and 610C are all the same PFET. Therefore by optimizing the NFETs shown 612A, 612B, and 612C to all have the same dimensions (i.e. length, width, and number of fingers) the NFET can be optimized across all three time points. Likewise, by optimizing the PFETs shown 610A, 610B, and 610C to all have the same dimensions (i.e. length, width, and number of fingers) the PFET can be optimized across all three time points. It should be understood that any number time points and therefore of instantiations are possible.

Further detail is now given for the needed circuit evaluation and equation manipulation. A software routine may convert netlist information into a transient optimization file which would include such instantiations. In some cases the software routine is call repeatedly for each cell. A cell is instantiated N-times, once for each time point. Each time point may be declared as a variable to be optimized with dT being an optimization variable. The input voltages and node voltage variables may be defined, including (where appropriate) the dV variables denoting the change in the voltage at a node from one time point to the next. Special care may be taken when introducing dV variables since values can be either positive or negative and optimization routines can require one type. Voltage variables may be defined for each node where a node can be either a net or a port.

Voltage assignments may be defined equating a specific port with a corresponding node voltage. Such assignments can be done at each time point. Capacitive current terms may be computed based on voltages changing across capacitors (i.e. $i=C*dv/dt$). dV and dT (where dT is delta time) terms can be computed between time points such as deltaV1=v2−v1 and dT1=t2−t1 where time point 1 is represented by (t1,v2) and time point 2 is represented by (t2,v2). Certain trans-capacitances (such as Cgd) are included as needed. Trans-capacitance current terms, i.e. $icc=cc*dvcc/dt$, may be subtracted from the main $i=c*dv/dt$ term for each trans-capacitance. In this case, cc is the trans-capacitance (i.e., Cgd), and dvcc is the voltage change in the node opposite the main node for which we are computing $i=C*dv/dt$.

Once the dynamic, capacitive currents have been defined, the positive and negative DC currents may be determined at each node and time point. The DC and dynamic currents are then used to generate the KCL equations. KCL equations may be written for nets within the circuit. In embodiments, if the node is a port, the DC and dynamic current terms are added to a port instance and these are used at an upper level of hierarchy to write the KCL equations.

Device instance equalities can be generated. Independent variables (i.e., length, width, number of fingers on a transistor, etc.) may be equated for each device declared at each time point. Dependent variables (e.g. Vgs, Ids, etc. . . . ) may change for a device at different time points, so only the independent variables are equated. Matrix definitions may be generated where matrix equality constraints repeat the transient KCL equations.

A KCL equation may be written at each node to completely define the behavior of the circuit. "M" refers to the number of KCL nodes in the circuit. Each of the M entries in the DC current vector as well as each row in the matrix corresponds to a dynamic node at a particular time point.

In embodiments, "P" may describe the number of dynamic nodes in a circuit and can be obtained by multiplying the number of node by the number of time points. P, however, may also include dynamic nodes connected to a voltage source. In many cases, P equals M. If P=M, then the diagonal terms in the matrix correspond to the total capacitance to all other nodes from that node at a particular time point. Although the dynamic nodes connected to a voltage source are not included in the KCL equations, the dV terms at these nodes could be important if a trans-capacitance is included. Trans-capacitances can result in non-diagonal terms in the capacitance matrix. All terms in the capacitance matrix may be zero except for trans-capacitances which essentially couples the KCL equation at a particular node with the changing voltage at some other node. In embodiments, because the capacitances only involve the voltages and currents at a particular time point (or more accurately, at a particular dT where dT2=t2−t1), the matrix will be block diagonal. To illustrate this concept, there are no terms relating dT1 with dT3, so the corresponding matrix entries will be zero.

The matrix equation, described as Idc=[C/dt]*dV, can be used by a solver routine to help the many non-convex KCL equality constraints converge to a stable, optimal solution. In this matrix equation Idc and dV are vectors of length P and M respectively, and [C/dt] is the "transcapacitance divided by delta-T" matrix. The transcapacitance terms in the matrix describe the capacitance between node P and node M (that is, between the node P at which the KCL equations are written and the node M at which we the delta-V value is computed). The "self-capacitance" (meaning that node P and node M are the same) is the capacitance to ground from that node. The capacitance to ground can be referred to as the diagonal capacitance. If M=P, then this self-capacitance will occur along the diagonal of the matrix. The time variable, delta-T, is repeated N times where N is the number of time points. The transcapacitances are computed at each time point when populating the capacitance matrix. Optimization may be done allowing each KCL equation to be relaxed at an initial solver iteration, checking the interim result against the matrix, and using this information in the subsequent solver iteration.

In some embodiments, the matrix information may only be written at the top-level. This is because the port currents are only defined at the lower level, and need to be included in the upper-level net KCL equations. Trans-capacitance current terms may need to be included at the higher-level where the cross-capacitance is connected between a port and an internal node of a sub-circuit (i.e. further down in the hierarchy). For these reasons, it is often most efficient to write the matrix information only once at the top-level instead of hierarchically at each cell level. In some cases, the matrix may be declared in sparse form.

Variables within the transient file may be declared before they are used although optimization variables can be set to a value later with an equality constraint. Equations can be written in a readable fashion in order to aid in debug since even for small circuits, the transient files can become very long. By grouping similar equations across nodes and/or time points, a user can easily read/identify equation blocks repeated for each node/time point and easily understand the functionality. Any equations blocks whose pattern is interrupted may denote a bug.

Figure 7:
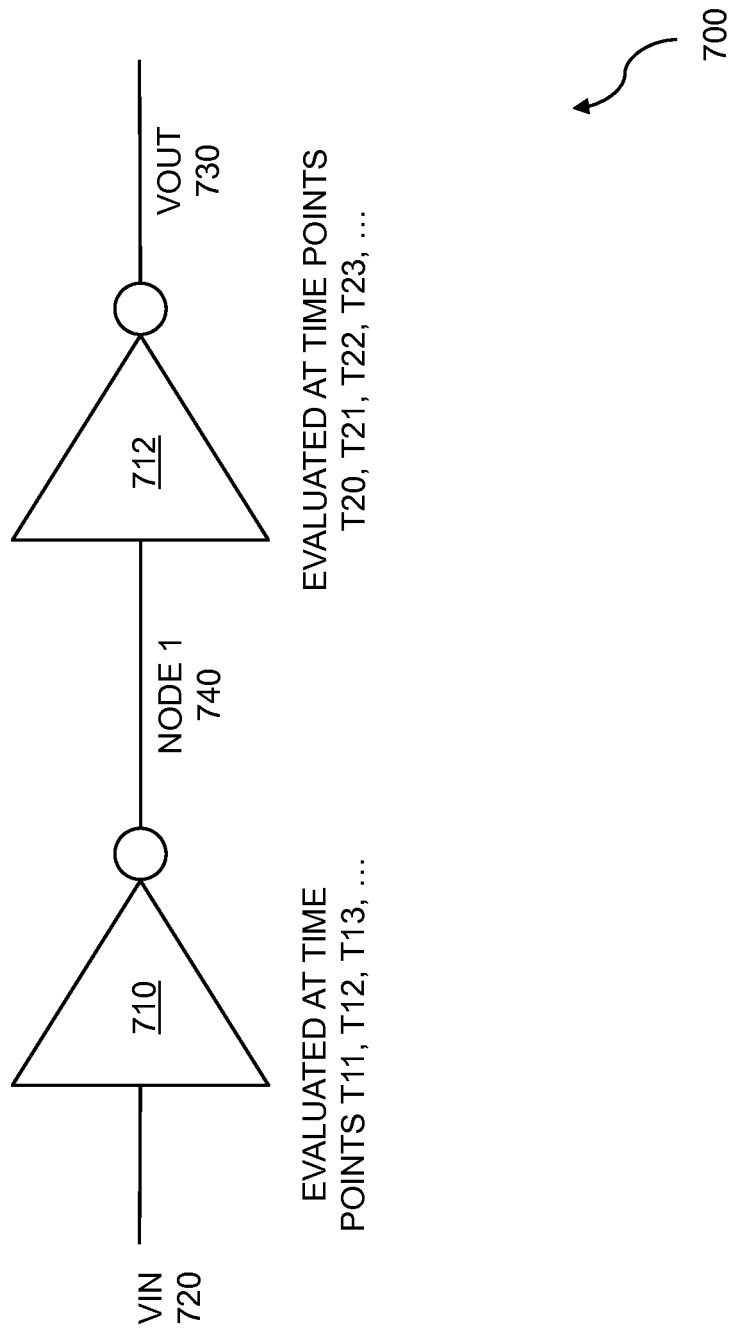
FIG. 7 shows an example circuit and second circuit.

FIG. 7 shows an example circuit and second circuit. A circuit combination 700 is shown including a first circuit 710 and a second circuit 720. The circuit combination 700 should be viewed as an example and not by way of limitation. Design optimization may include optimizing the second circuit coupled to the circuit wherein the circuit and the second circuit are optimized together. The circuit and the second circuit may be optimized at different time points.

An input VIN 720 provides input to a first inverter 710. The output of the first inverter 710 is connected to node 1 740. Node 1 740 is connected to the input of a second inverter 712. The output of the second inverter 712 is connected to VOUT 730. The circuit combination 700 may be optimized using the disclosed concepts. The first inverter 710 and the second inverter 712 may be optimized together. Various types of optimization are possible, such as reducing the delay through the circuit combination 700. The first inverter 710 and the second inverter 712 may be evaluated at different time points. There may even be different number of time points for evaluating the first inverter 710 and the second inverter 712. The first inverter 710 and the second inverter 712 may be different inverters and therefore be different sizes. As a rule of thumb, it has been seen that a scaling factor of "e" between inverter stages is often useful to optimize timing. But by using the disclosed concepts, equations may be prepared and optimization performed that is far more accurate than such an empirical rule. It should be understood that various circuit arrangements are possible. The circuit may include multiple levels of hierarchy. The multiple levels of hierarchy may be optimized together.

In embodiments, if there is more than one level of hierarchy, a software routine can be called once for each level or even for each cell within the level. Hierarchy information can be used to build matrices and remove the redundant, or equivalent, nodes such as where nets are connected together across hierarchy through ports. In this manner, many circuits in combination with one another can be optimized.

Figure 8:
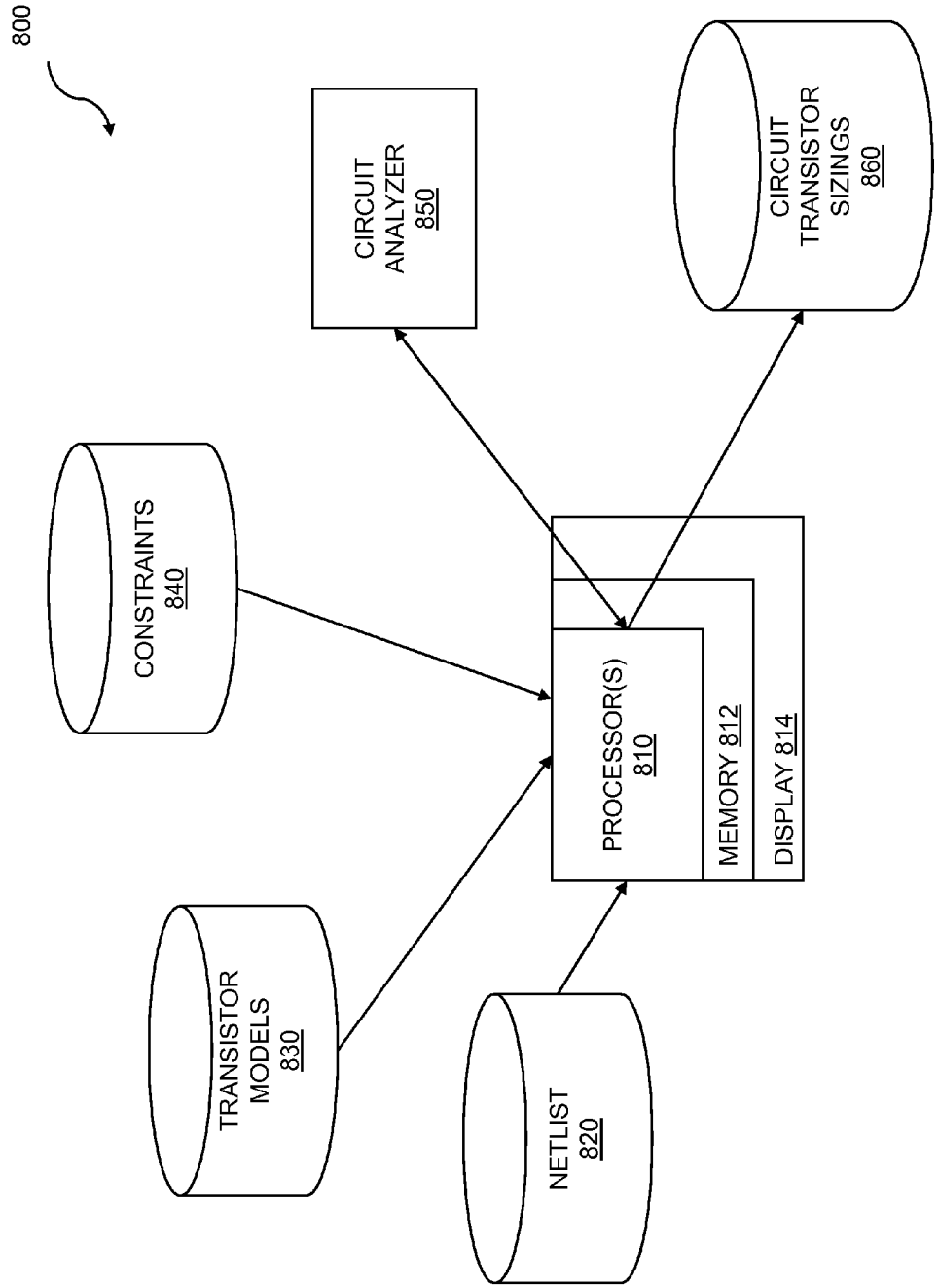
FIG. 8 is a system diagram for circuit analysis.

FIG. 8 is a system diagram for circuit analysis. A system 800 for circuit evaluation may comprise one or more processors 810 coupled to a memory 812, which stores instructions, and a display 814. The memory 812 may store code, timing analysis, design data, instructions, system support data, intermediate data, analysis results, and the like. The display 814 may be any electronic display, including but not limited to, a computer display, a laptop screen, a net-book screen, a tablet computer screen, a cell phone display, a mobile device display, a remote with a display, a television, a projector, or the like. The processors 810 may obtain a representation for a design, such as a netlist 820. The design may include multiple devices such as transistors, resistors, capacitors, and inductors. The devices may be described by equations. These equations, e.g. transistors models 830, may be imported by the processors 810. In some embodiments, the processors 810 evaluate and determine the equations for the devices in the circuits. In some cases, constraints 840 for the circuit as described by the netlist 820 are obtained. The processors 810 access a circuit analyzer 850 module to evaluate the circuit. Multiple time points are selected for circuit evaluation. The circuit is instantiated once for each of these multiple time points. The circuit analyzer 850 evaluates the circuit for each of these instantiations to optimize the circuit. Various types of optimizations are possible including reducing delay, reducing power, reducing area, etc. In some cases optimization will be a combination of these (delay, power, and area) factors. An optimization can involve a weighted combination of these factors. Further, optimization can involve other factors as well. During optimization, sizings for the devices that make up the circuit can be determined. Device sizings, including circuit transistor sizings 860, which were optimized may be provided based on the analyzing that was performed. In at least one embodiment, the circuit analyzer 850 function is performed by the one or more processors 810.

The system 800 may include computer program product embodied in a non-transitory computer readable medium comprising: code for obtaining a representation for a circuit wherein the representation describes a plurality of devices and connections between the devices; code for importing models for the plurality of devices included in the representation; code for identifying N time points of operation for the circuit; code for instantiating the circuit N times; and code for optimizing the circuit simultaneously at the N time points.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for circuit evaluation comprising:

obtaining a representation for a circuit wherein the representation describes a plurality of devices and connections between the devices wherein the devices comprise transistors which transition through a plurality of regions of operation;

importing models for the plurality of devices included in the representation;

identifying, using one or more processors, N time points of operation for the circuit;

instantiating the circuit N times for simulation where the simulation is performed on the plurality of regions of operation where the regions of operation include two or more of off, sub-threshold leakage, linear, and saturated states; and optimizing the circuit simultaneously at the N time points through the N simulation instantiations.

2. The method of claim 1 wherein the devices further include one or more of capacitors, inductors, or resistors.

3. The method of claim 1 wherein the optimizing includes setting transistor dimensions for the transistors within the circuit.

4. The method of claim 3 wherein the transistor dimensions includes one or more of lengths, widths, or finger numbers.

5. The method of claim 1 wherein the optimizing includes one or more of reducing delay through the circuit, reducing power consumption for the circuit, or reducing area for the circuit.

6. The method of claim 1 further comprising capturing transient behavior of the circuit for each of the N time points.

7. The method of claim 1 wherein simulation is performed on the plurality of regions of operation.

8. The method of claim 1 further comprising linking each of the plurality of regions for circuit design.

9. The method of claim 1 wherein the representation includes a schematic.

10. The method of claim 1 wherein the representation includes a netlist.

11. The method of claim 1 wherein the time points are linked by a voltage delta.

12. The method of claim 11 wherein the voltage delta is based on dynamic currents within the circuit.

13. The method of claim 12 wherein the dynamic currents are based on capacitances within the circuit.

14. The method of claim 1 wherein the time points are linked by a current delta.

15. The method of claim 14 wherein the current delta is based on dynamic voltages within the circuit.

16. The method of claim 15 wherein the dynamic voltages are based on inductances within the circuit.

17. The method of claim 1 further comprising determining DC currents for nodes within the circuit.

18. The method of claim 17 further comprising generating Kirchhoff current law equations for the nodes using the DC currents.

19. The method of claim 17 further comprising determining dynamic currents for the nodes within the circuit.

20. The method of claim 19 further comprising generating Kirchhoff current law equations for the nodes using the dynamic currents.

21. The method of claim 20 wherein the Kirchhoff current law equations are relaxed at an initial solver iteration.

22. The method of claim 1 wherein the models for the plurality of devices include convex polynomial equations.

23. The method of claim 1 wherein the models for the plurality of devices include non-convex signomial equations.

24. The method of claim 1 wherein the optimizing includes non-linear optimization techniques.

25. The method of claim 1 further comprising determining a DC operating point for the circuit.

26. The method of claim 25 further comprising initializing the plurality of devices based on the DC operating point.

27. The method of claim 1 further comprising constraining behavior of the circuit during the N times.

28. The method of claim 1 further comprising generating transient equations for the circuit.

29. The method of claim 1 further comprising generating AC noise equations for the circuit.

30. The method of claim 1 further comprising optimizing a second circuit coupled to the circuit wherein the circuit and the second circuit are optimized together.

31. The method of claim 30 wherein the circuit and the second circuit are optimized at different time points.

32. The method of claim 1 wherein the circuit includes multiple levels of hierarchy.

33. The method of claim 32 wherein the multiple levels of hierarchy are optimized together.

34. A computer program product embodied in a non-transitory computer readable medium for circuit evaluation, the computer program product comprising:

code for obtaining a representation for a circuit wherein the representation describes a plurality of devices and connections between the devices wherein the devices comprise transistors which transition through a plurality of regions of operation;

code for importing models for the plurality of devices included in the representation;

code for identifying N time points of operation for the circuit;

code for instantiating the circuit N times for simulation where the simulation is performed on the plurality of regions of operation where the regions of operation include two or more of off, sub-threshold leakage, linear, and saturated states; and code for optimizing the circuit simultaneously at the N time points through the N simulation instantiations.

35. The computer program product of claim 34 wherein the models for the plurality of devices include convex polynomial equations.

36. The computer program product of claim 34 further comprising optimizing a second circuit coupled to the circuit, wherein the circuit and the second circuit are optimized together and wherein the circuit and the second circuit are optimized at different time points.

37. A computer system for circuit evaluation comprising:
a memory which stores instructions;
one or more processors coupled to the memory wherein the one or more processors are configured to:

obtain a representation for a circuit wherein the representation describes a plurality of devices and connections between the devices wherein the devices comprise transistors which transition through a plurality of regions of operation;

import models for the plurality of devices included in the representation;

identify N time points of operation for the circuit;

instantiate the circuit N times for simulation where the simulation is performed on the plurality of regions of operation where the regions of operation include two or more of off, sub-threshold leakage, linear, and saturated states; and optimize the circuit simultaneously at the N time points through the N simulation instantiations.

38. The system of claim 37 wherein the models for the plurality of devices include convex polynomial equations.

39. The system of claim 37 further comprising optimizing a second circuit coupled to the circuit wherein the circuit and the second circuit are optimized together and wherein the circuit and the second circuit are optimized at different time points.

* * * * *